United States Patent
Adam et al.

(10) Patent No.: US 8,232,172 B2
(45) Date of Patent: Jul. 31, 2012

(54) STRESS ENHANCED TRANSISTOR DEVICES AND METHODS OF MAKING

(75) Inventors: Thomas N. Adam, Poughkeepsie, NY (US); Judson R. Holt, Wappingers Falls, NY (US); Thomas A. Wallner, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/045,679

(22) Filed: Mar. 11, 2011

(65) Prior Publication Data

US 2011/0159655 A1   Jun. 30, 2011

Related U.S. Application Data

(62) Division of application No. 12/136,195, filed on Jun. 10, 2008, now abandoned.

(51) Int. Cl.
*H01L 21/336* (2006.01)
(52) U.S. Cl. ........................... 438/300; 438/299
(58) Field of Classification Search .................. 438/300, 438/299
See application file for complete search history.

(56) References Cited

U.S. PATENT DOCUMENTS

| | | | |
|---|---|---|---|
| 5,864,161 A | 1/1999 | Mitani et al. | |
| 6,074,919 A | 6/2000 | Gardner et al. | |
| 6,162,694 A | 12/2000 | Cheek et al. | |
| 6,784,076 B2 | 8/2004 | Gonzalez et al. | |
| 7,045,407 B2 | 5/2006 | Keating et al. | |
| 7,303,949 B2 | 12/2007 | Chen et al. | |
| 7,579,617 B2 | 8/2009 | Shimamune et al. | |
| 7,625,776 B2 | 12/2009 | Wells et al. | |
| 2003/0104645 A1 | 6/2003 | Weon et al. | |
| 2008/0237741 A1 | 10/2008 | Ranade et al. | |
| 2008/0283906 A1 | 11/2008 | Bohr | |
| 2009/0280612 A1 | 11/2009 | Shimamune et al. | |

*Primary Examiner* — N Drew Richards
*Assistant Examiner* — Grant Withers
(74) *Attorney, Agent, or Firm* — Cantor Colburn LLP; Katherine Brown

(57) ABSTRACT

Stress enhanced transistor devices and methods of fabricating the same are provided. In one embodiment, a transistor device comprises: a gate conductor disposed above a semiconductor substrate between a pair of dielectric spacers, wherein the semiconductor substrate comprises a channel region underneath the gate conductor and recessed regions on opposite sides of the channel region, wherein the recessed regions undercut the dielectric spacers to form undercut areas of the channel region; and epitaxial source and drain regions disposed in the recessed regions of the semiconductor substrate and extending laterally underneath the dielectric spacers into the undercut areas of the channel region.

6 Claims, 12 Drawing Sheets

STRESS ENHANCED TRANSISTOR DEVICES AND METHODS OF MAKING

CROSS-REFERENCE TO RELATED APPLICATIONS

This is a divisional of U.S. patent application Ser. No. 12/136,195, which was filed Jun. 10, 2008, the disclosure of which is incorporated by reference herein in its entirety.

BACKGROUND

This invention relates to semiconductor fabrication, and particularly to fabricating transistor devices comprising epitaxial source and drain regions disposed in recessed regions of a semiconductor substrate that undercut an overlying gate structure to increase the stress applied to the channel region.

Integrated circuits often employ active devices known as transistors such as field effect transistors (FETs). A FET includes a silicon-based substrate comprising a pair of impurity regions, i.e., source and drain junctions, spaced apart by a channel region. A gate conductor is dielectrically spaced above the channel region of the silicon-based substrate. The junctions can comprise dopants which are opposite in type to the dopants residing within the channel region interposed between the junctions. The gate conductor can comprise a doped semiconductive material such as polycrystalline silicon ("polysilicon"). The gate conductor can serve as a mask for the channel region during the implantation of dopants into the adjacent source and drain junctions. An interlevel dielectric can be disposed across the transistors of an integrated circuit to isolate the gate areas and the junctions. Ohmic contacts can be formed through the interlevel dielectric down to the gate areas and/or junctions to couple them to overlying interconnect lines.

Demands for increased performance, functionality, and manufacturing economy for integrated circuits have resulted in extreme integration density and scaling of devices to very small sizes. Transistor device scaling has restricted operating margins and has adversely affected the electrical characteristics of such devices. As such, more emphasis has been placed on achieving higher operating frequencies for transistor devices through the use of stress engineering to improve the carrier mobility of such devices rather than through the use of scaling.

Carrier mobility in the channel of a FET device can be improved by applying mechanical stresses to the channel to induce tensile and/or compressive strain in the channel. The application of such mechanical stresses to the channel can modulate device performance and thus improve the characteristics of the FET device. For example, a process-induced tensile strain in the channel of an n-type (NFET) device can create improved electron mobility, leading to higher saturation currents.

One method used to induce strain in the channel region has been to place a compressively strained nitride film close to the active region of the FET device. Another approach taken to induce strain in the channel of a p-type (PFET) device has been to epitaxially grow silicon germanium (e-SiGe) in the source and drain regions of the silicon-based substrate. When epitaxially grown on silicon, an unrelaxed SiGe layer can have a lattice constant that conforms to that of the silicon substrate. Upon relaxation (e.g., through a high temperature process) the SiGe lattice constant approaches that of its intrinsic lattice constant, which is larger than that of silicon. Consequently, physical stress due to this mismatch in the lattice constant is applied to the silicon-based channel region.

BRIEF SUMMARY

The shortcomings of the prior art are overcome and additional advantages are provided through the provision of stress enhanced transistor devices and methods of fabricating the same. In one embodiment, a transistor device comprises: a gate conductor disposed above a semiconductor substrate between a pair of dielectric spacers, wherein the semiconductor substrate comprises a channel region underneath the gate conductor and recessed regions on opposite sides of the channel region, wherein the recessed regions undercut the dielectric spacers to form undercut areas of the channel region; and epitaxial source and drain regions disposed in the recessed regions of the semiconductor substrate and extending laterally underneath the dielectric spacers into the undercut areas of the channel region.

In another embodiment, a method of fabricating a transistor device, comprises: providing a semiconductor topography comprising a gate conductor disposed above a semiconductor substrate between a pair of dielectric spacers; anisotropically etching exposed regions of the semiconductor substrate on opposite sides of the dielectric spacers to form recessed regions in the substrate spaced apart by a channel region; selectively etching exposed sidewalls of the channel region to undercut the dielectric spacers; and growing epitaxial source and drain regions in the recessed regions of the semiconductor substrate such that the epitaxial source and drain regions extend underneath the dielectric spacers.

In yet another embodiment, a method of fabricating a transistor device, comprising: providing a semiconductor topography comprising a gate conductor disposed above a semiconductor substrate between a pair of dielectric spacers; selectively etching exposed regions of the semiconductor substrate on opposite sides of the dielectric spacers to form recessed regions in the substrate that undercut the dielectric spacers and define a channel region between the recessed regions comprising undercut areas; and growing epitaxial source and drain regions in the recessed regions of the semiconductor substrate such that the epitaxial source and drain regions extend underneath the dielectric spacers into the undercut areas of the channel region.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Stress enhanced FET devices can be fabricated by forming epitaxially grown source and drain regions in recessed regions of a semiconductor substrate that extend laterally underneath the overlying gate structure into undercut areas of the channel region. As such, the epitaxially grown material is strategically placed as close as possible to the channel (even partially underneath the channel) to maximize the stress applied to the channel and thus enhance the carrier mobility in the channel.

Figure 1:
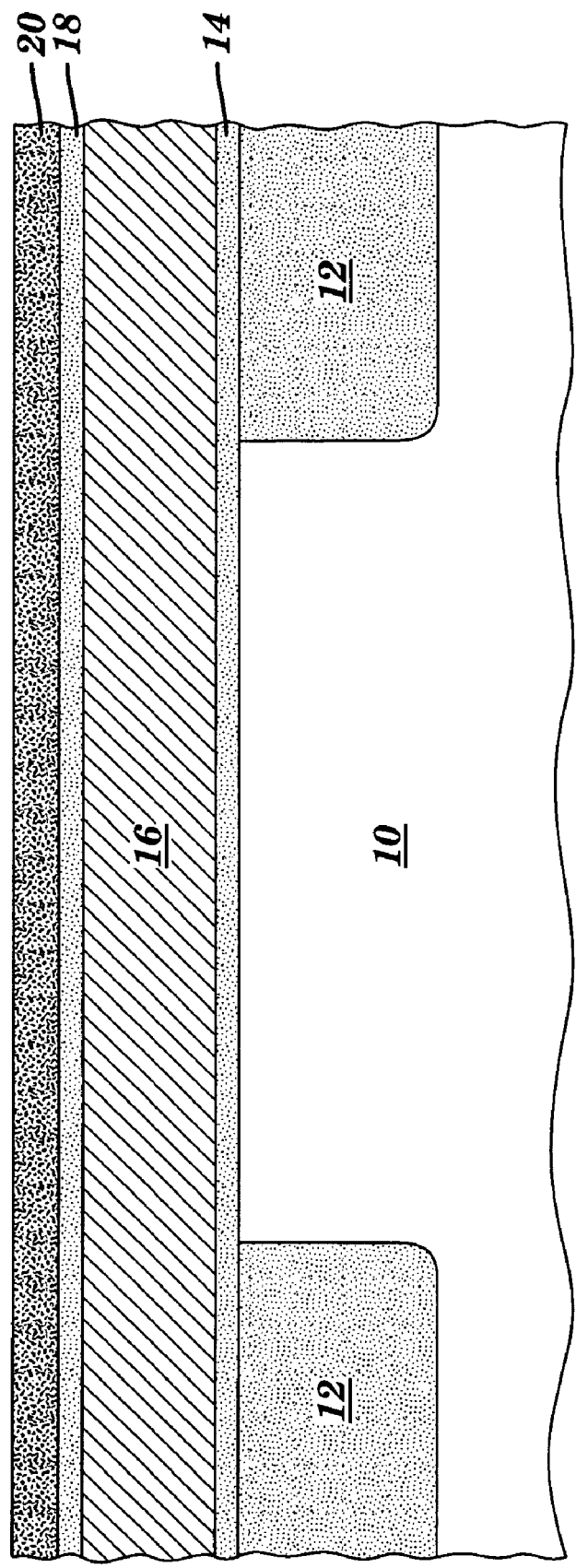
FIGS. 1-6 illustrate another example of a method for fabricating a stress enhanced transistor device.

Turning now to the drawings in greater detail, it will be seen that FIGS. 1-6 illustrate a first exemplary embodiment of a method for fabricating stress enhanced FET devices. As shown in FIG. 1, a bulk semiconductor substrate 10 comprising single crystalline silicon that has been slightly doped with n-type or p-type dopants is first obtained to form the FET device. Alternatively, a semiconductor layer 10 can be formed upon an insulation layer (not shown) to create a silicon-on-insulator FET device. Shallow trench isolation structures 12 can be formed in the semiconductor substrate 10 on opposite sides of the ensuing FET device to isolate it from other active areas in the substrate 10. A gate dielectric 14 comprising e.g., thermally grown silicon dioxide ($SiO_2$) or hafnium-based oxide (such as $HfO_3$) deposited by chemical vapor deposition (CVD), can be formed across the semiconductor substrate 10. A gate conductor layer 16 comprising, e.g., polycrystalline silicon ("polysilicon"), can then be deposited across the gate dielectric 60. Dielectric capping layers, such as silicon dioxide ("oxide") layer 18 and silicon nitride ("nitride", $Si_3N_4$) layer 20, can then be deposited across the gate conductor layer 16.

Figure 2:
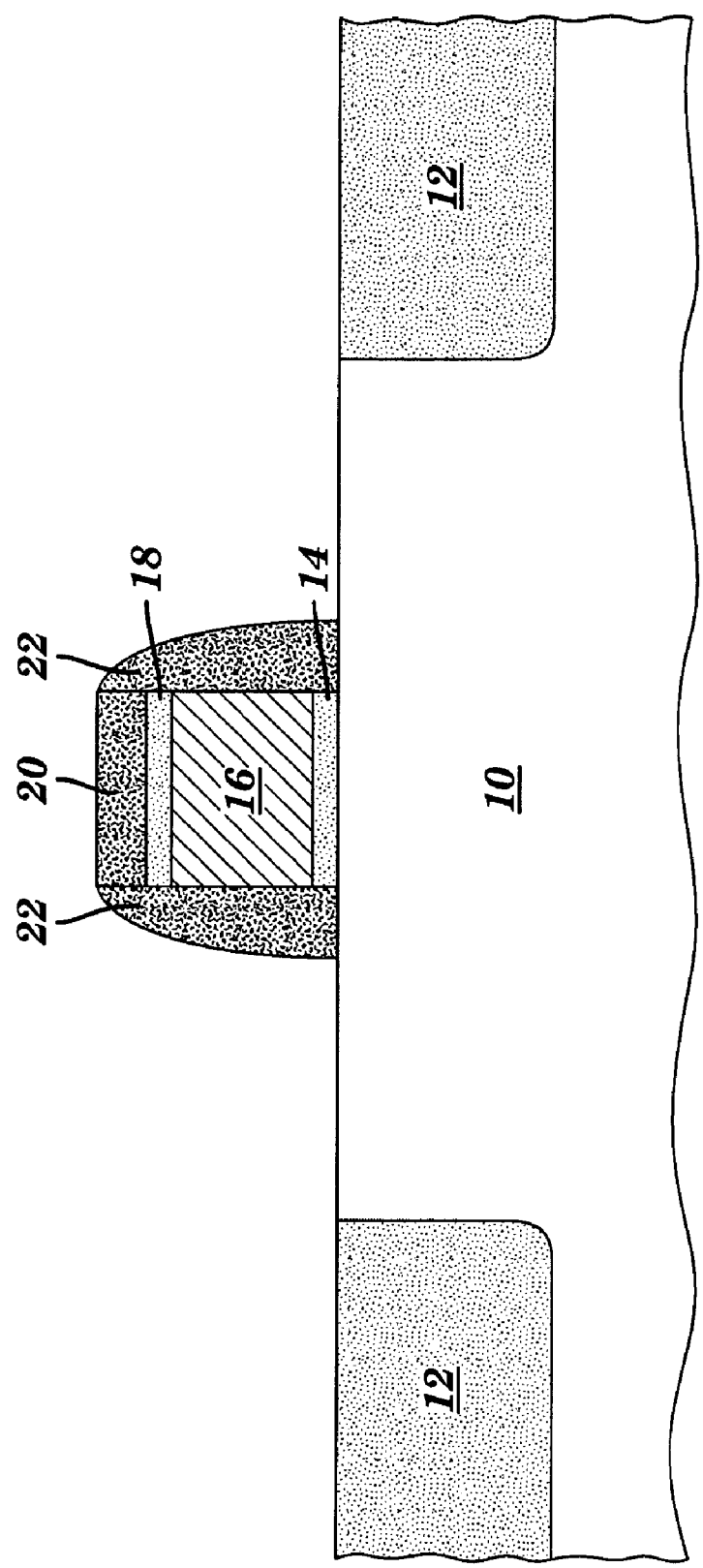

Next, the gate conductor layer 16, the gate dielectric 14, the oxide layer 18, and the nitride layer 20 can be patterned using lithography and an anisotropic etch technique, e.g., reactive ion etching (RIE), to form the gate conductor structure shown in FIG. 2. Dielectric spacers 22 comprising a dielectric such as nitride can be formed upon the opposed sidewall surfaces of the gate conductor 16 via CVD of a dielectric followed by an RIE process, which etches the dielectric at a faster rate in the vertical direction than in the horizontal direction.

Figure 3:
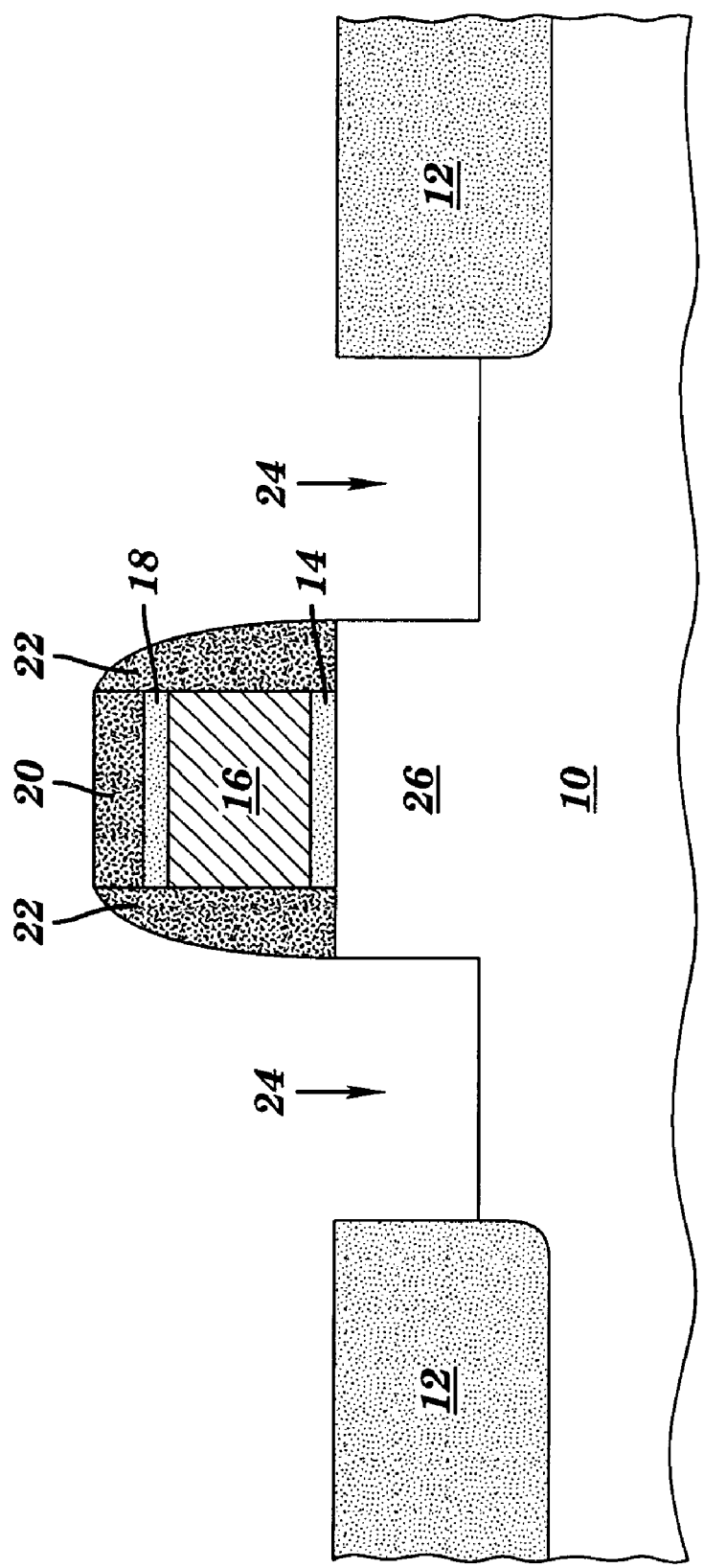
Figure 4:
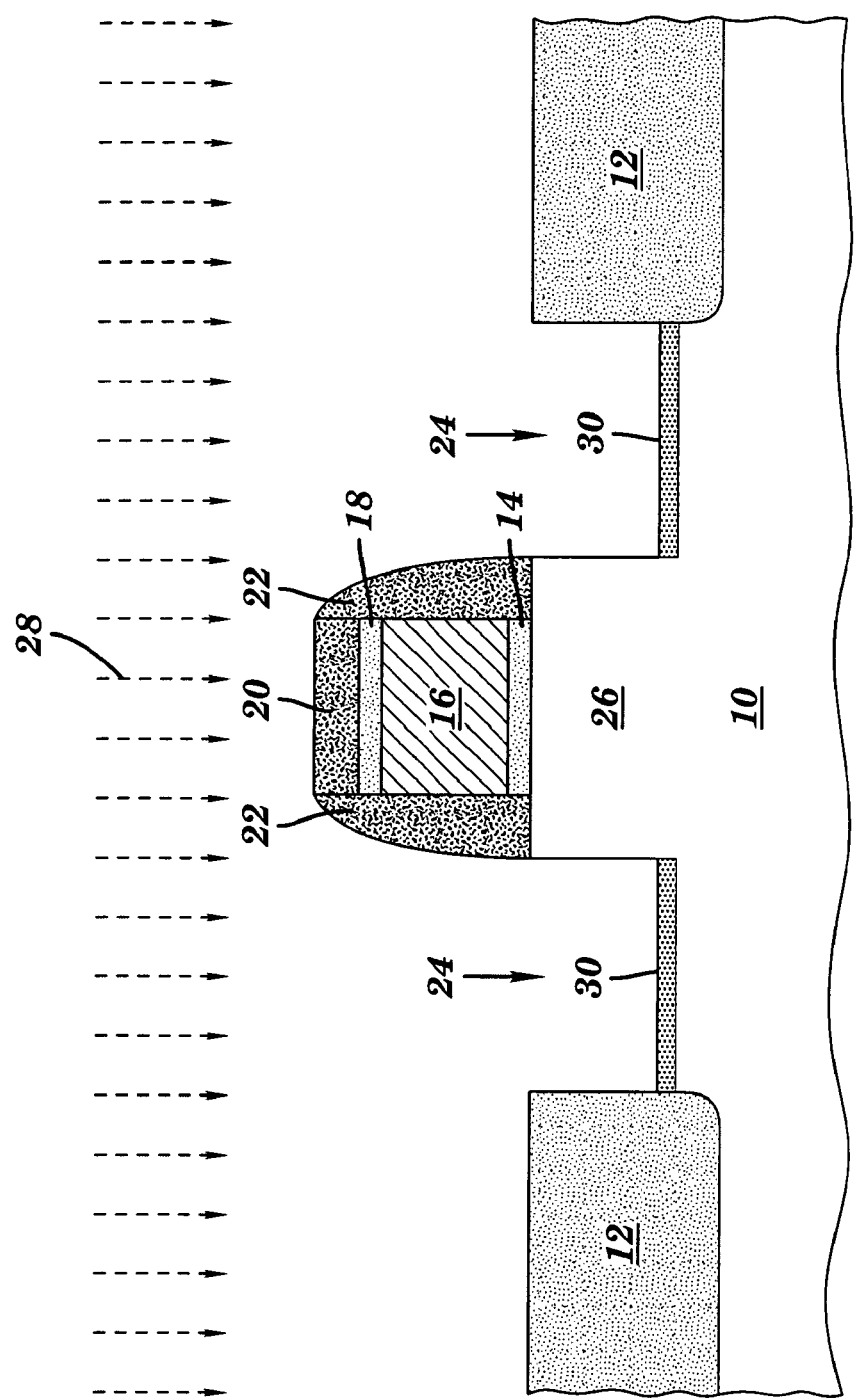

Turning now to FIG. 3, recessed regions 24 can subsequently be formed in the semiconductor substrate 10 using lithography and an RIE process. The formation of the recessed regions 24 clearly defines the channel region 26. Next, as shown in FIG. 4, ion implantation (illustrated by arrows 28) can be used to form etch stop regions 30 in the semiconductor substrate 10 beneath the recessed regions 24. In one embodiment, p-type dopants can be implanted if the transistor being formed is an NFET device, whereas n-type dopants can be implanted if the transistor being formed is a PFET device. Examples of n-type dopants include, but are not limited to, arsenic, phosphorus, and combinations comprising at least one of the foregoing dopants. Examples of p-type dopants include, but are not limited to, boron, boron difluoride, and combinations comprising at least one of the foregoing dopants. It is to be understood that both NFET and PFET devices can be formed in the semiconductor substrate 10 to form a CMOS (complementary metal-oxide semiconductor) integrated circuit. By way of example, boron (B) can be implanted at a low energy of less than about 10 keV and a dosage of about $2 \times e^{14}$ ions/$cm^2$ to about $2 \times e^{15}$ ions/$cm^2$, more specifically about $5 \times e^{14}$ ions/$cm^2$ to about $2 \times e^{15}$ ions/$cm^2$. Similarly, boron difluoride ($BF_2$) can be implanted at a low energy of less than about 10 keV and a dosage of about $2 \times e^{14}$ ions/$cm^2$ to about $1 \times e^{15}$ ions/$cm^2$, more specifically about $5 \times e^{14}$ ions/$cm^2$ to about $1 \times e^{15}$ ions/$cm^2$. In a preferred embodiment, $BF_2$ is implanted at an energy of about 3 keV and a dosage of about $5 \times e^{14}$ ions/$cm^2$.

In an alternative embodiment, electrically inactive species or amorphizing species capable of damaging the crystallinity of the silicon can be implanted into the recessed silicon to form etch stop regions 30. Examples of electrically inactive species include, but are not limited to, silicon, germanium, carbon, xenon, and combinations comprising at least one of the foregoing species. As an example, xenon can be implanted at an energy of about 5 keV and a dosage of about $5 \times e^{14}$ ions/$cm^2$.

Figure 5:
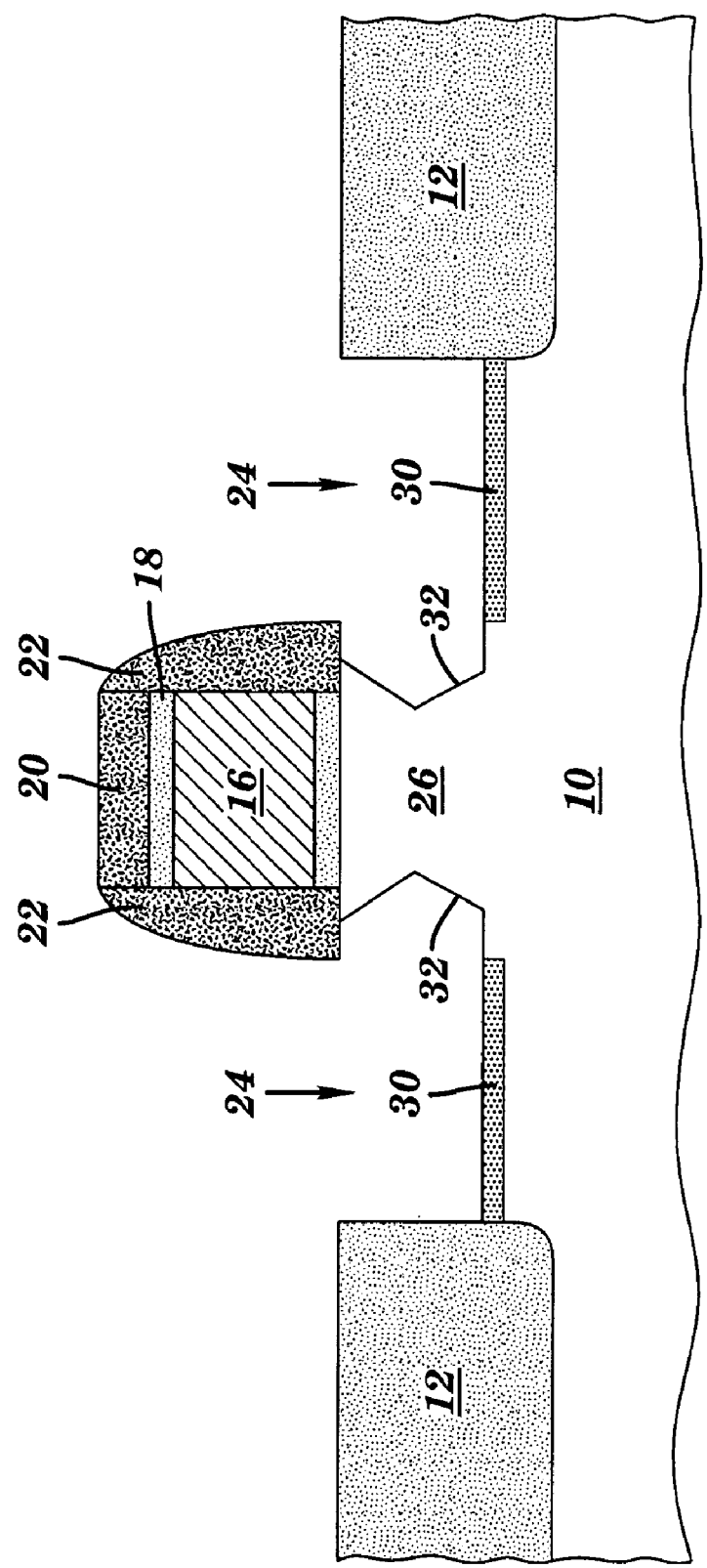

As depicted in FIG. 5, after the ion implantation step, sidewalls 32 of the channel region 26 can be etched using an isotropic wet etch chemistry that is selective to silicon. For example, the recessed regions 24 of the substrate 10 can be contacted with a hydroxide etchant such as tetramethylammonium hydroxide (TMAH), ammonium hydroxide ($NH_4OH$), sodium hydroxide (NaOH), potassium hydroxide (KOH), etc. The doped etch stop regions 30 can inhibit etching of those areas of substrate 10 beneath recessed regions 24. Further, the oxide and nitride layers 18 and 20 can protect the gate conductor 16 from being etched. As a result of being subjected to an isotropic etch, which etches at the same rate in the vertical and horizontal directions, the sidewalls 32 of the channel region 26 can become indented as shown such that the channel region 26 is substantially shaped as an hourglass. The etch is performed for a period of time effective to cause the recessed regions 24 to undercut the dielectric spacers 22 and thus form undercut areas in the channel region 26.

Figure 6:
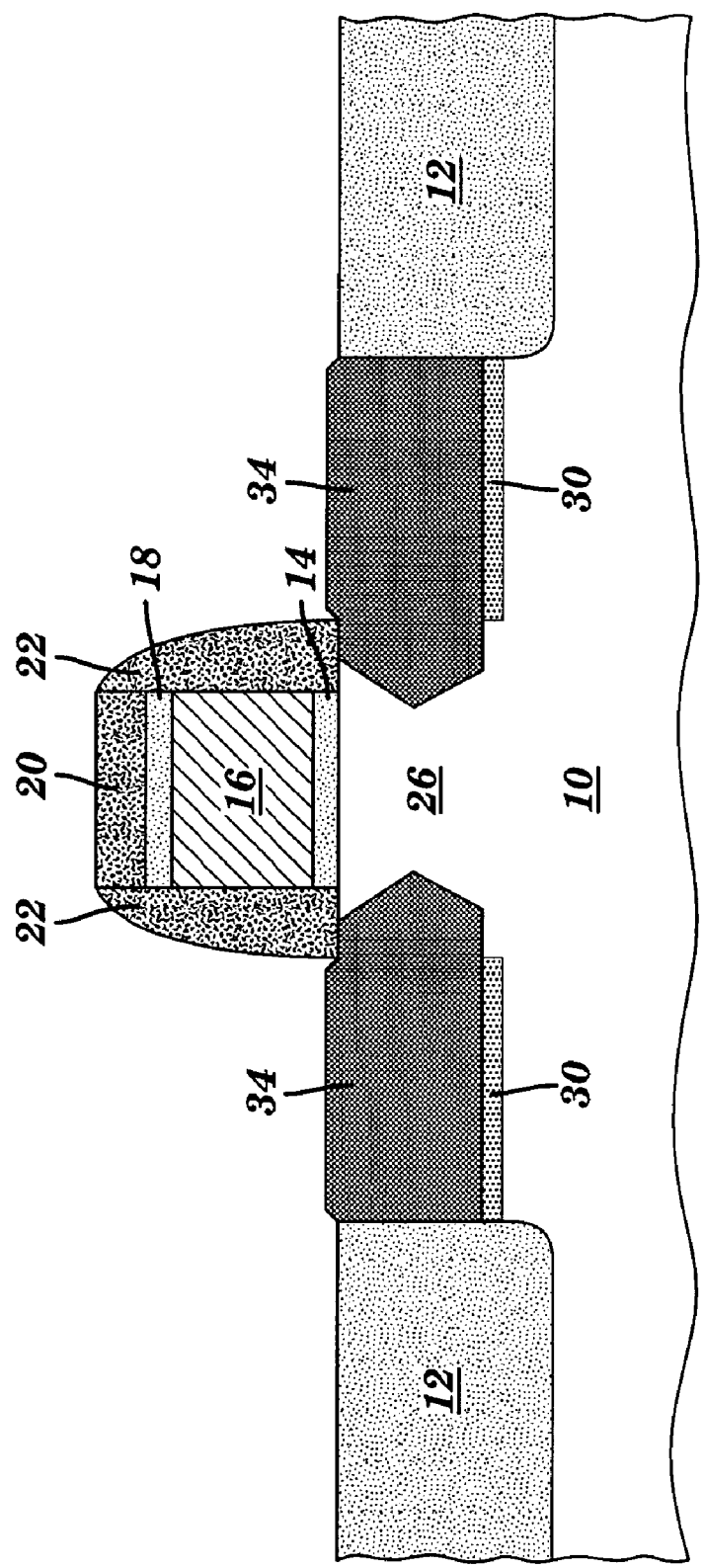

As shown in FIG. 6, epitaxially grown source and drain regions 34 can subsequently be formed in the recessed regions such that they extend laterally under the dielectric spacers 22 into the undercut areas of the channel region 26. The epitaxial growth can be performed at a temperature of about 500° C. to about 900° C. and a pressure of about 1 Torr to about 100 Torr using precursors such as $SiH_4$, $SiH_2Cl_2$, $GeH_4$, HCl, $B_2H_6$, $SiH_3CH_3$, etc. In a preferred embodiment, the epitaxial growth is performed at a temperature of about 700° C. and a pressure of about 10 Torr. When forming a PFET device, the epitaxial source and drain regions 34 can comprise, e.g., silicon germanium (SiGe), and when forming an NFET device, the epitaxial source and drain regions 34 can comprise, e.g., silicon carbide (SiC). The nitride and oxide capping layers 18 and 20 can then be removed to allow metal silicide contact areas and then metal contacts to be formed on the gate conductor 16 and the epitaxial source and drain regions 34. One method that can be employed to remove the capping layers 18 and 20 can be through the use of an isotropic etch that also removes the dielectric spacers 22, which can be reformed as described previously. On the other hand, the capping layers 18 and 20 can be removed using an RIE process.

Figure 7:
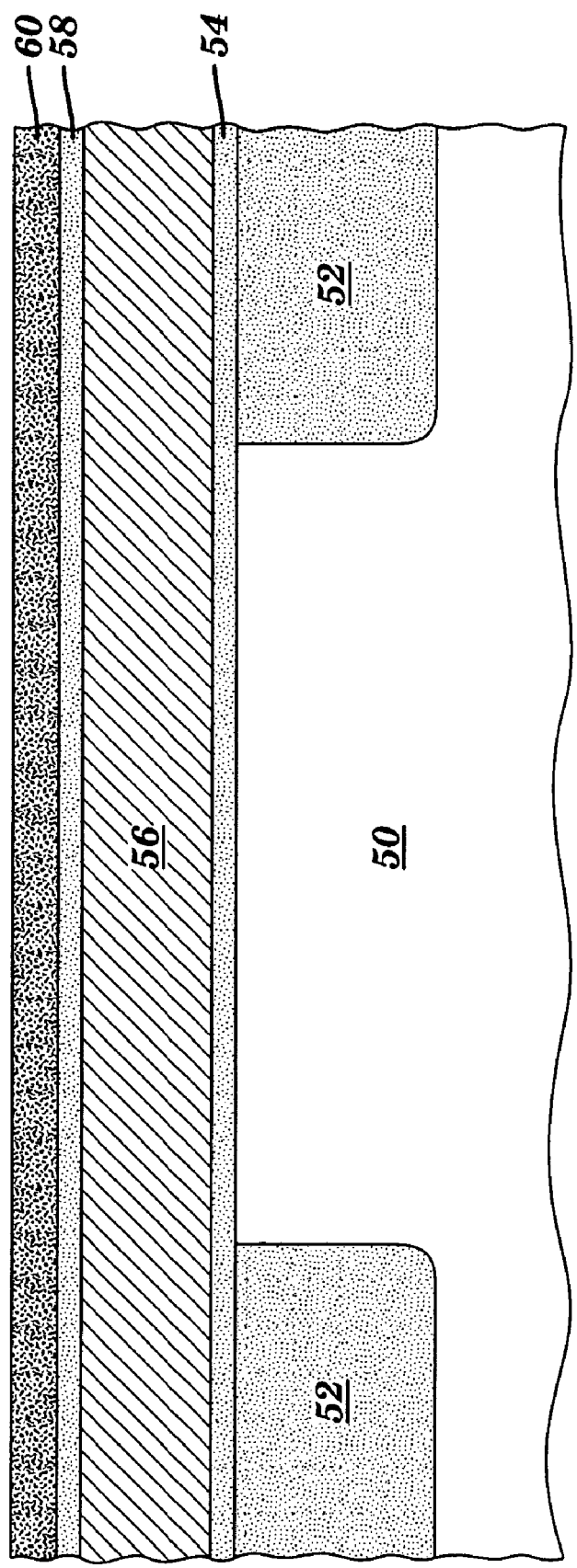
FIGS. 7-12 illustrate another example of a method for fabricating a stress enhanced transistor device.
Figure 8:
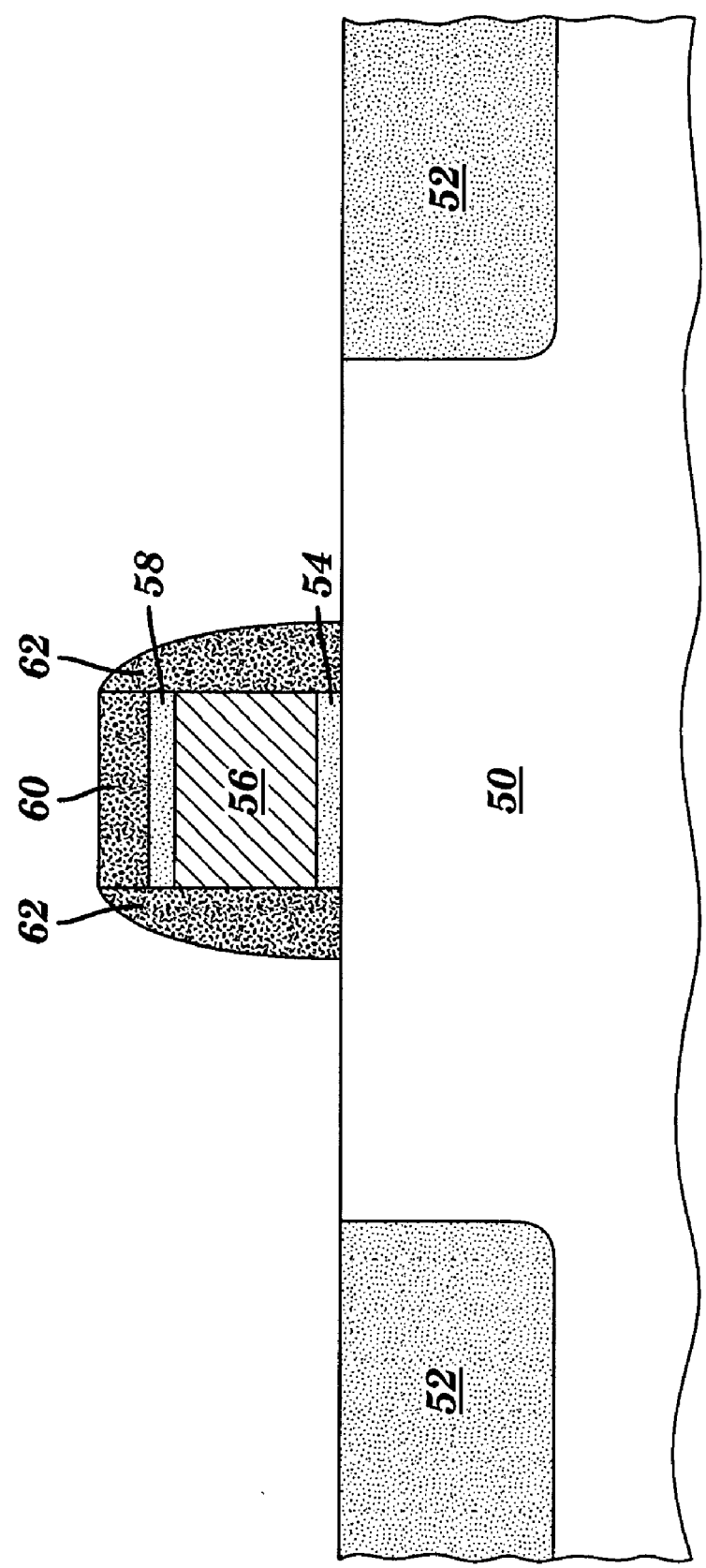

FIGS. 7-12 illustrate a second exemplary embodiment of a method for fabricating stress enhanced FET devices. As shown in FIG. 7, a gate dielectric layer 54, a gate conductor layer 56, an oxide capping layer 58, and a nitride capping layer 60 can be formed upon a semiconductor substrate 50 in the same manner as described in the first embodiment. The shown section of the semiconductor substrate 50 can be isolated from other areas of the substrate 50 by, e.g., trench isolation regions 52. Next, the gate dielectric layer 54, the gate conductor layer 56, and the capping layers 58 and 60 can be patterned using lithography and an anisotropic etch technique to form the gate conductor structure shown in FIG. 8. It is recognized that the gate dielectric 54 could alternatively be patterned later during a later stage of the fabrication method. Dielectric spacers 62 can further be formed on the sidewall surfaces of the gate conductor 56 in the same manner as described in the first embodiment.

Figure 9:
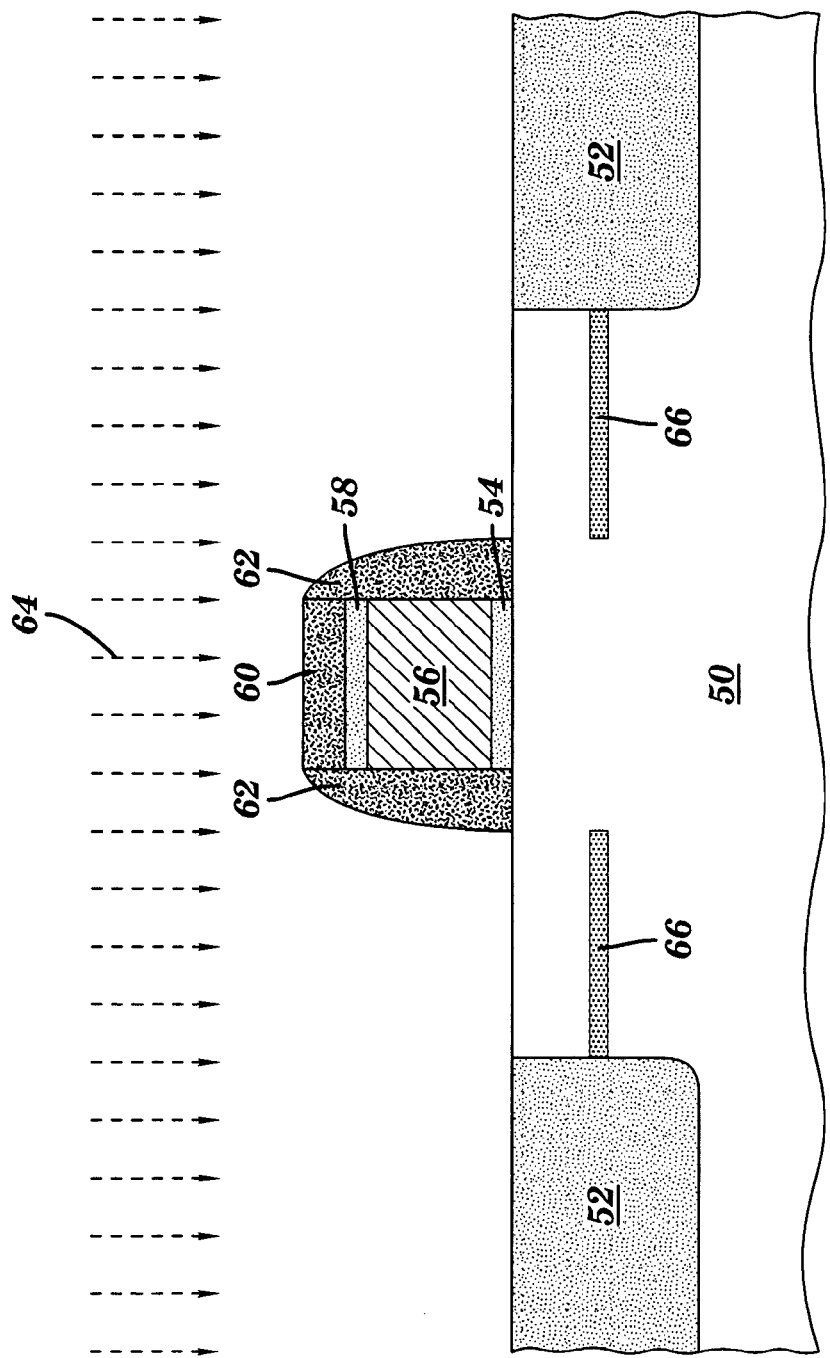

Turning now to FIG. 9, a deep ion implantation process (illustrated by arrows 64) can be used to form etch stop regions 66 in the semiconductor substrate 50 a spaced distance below the surface of the substrate 50 in the same manner that the etch stop regions are formed in the first embodiment except that a higher implantation energy is employed. That is, p-type species, n-type species, or an electronically inactive species can be implanted in regions of the substrate 50 below where source and drain regions are to be subsequently formed. By way of example, B can be implanted at an implantation energy of about 10 keV to about 100 keV and a dosage of about $2 \times e^{14}$ ions/cm$^2$ to about $2 \times e^{15}$ ions/cm$^2$, more specifically about $5 \times e^{14}$ ions/cm$^2$ to about $2 \times e^{15}$ ions/cm$^2$. Similarly, BF$_2$ can be implanted at an energy of about 10 keV to about 100 keV and a dosage of about $2 \times e^{14}$ ions/cm$^2$ to about $1 \times e^{15}$ ions/cm$^2$, more specifically about $5 \times e^{14}$ ions/cm$^2$ to about $1 \times e^{15}$ ions/cm$^2$. In one particular embodiment, B can be implanted at an energy of about 25 keV and a dosage of about $1 \times e^{15}$ ions/cm$^2$. At this point, the gate dielectric 54 can be removed from above regions of the substrate 50 outside of the dielectric spacers 62 if not previously removed.

Figure 10:
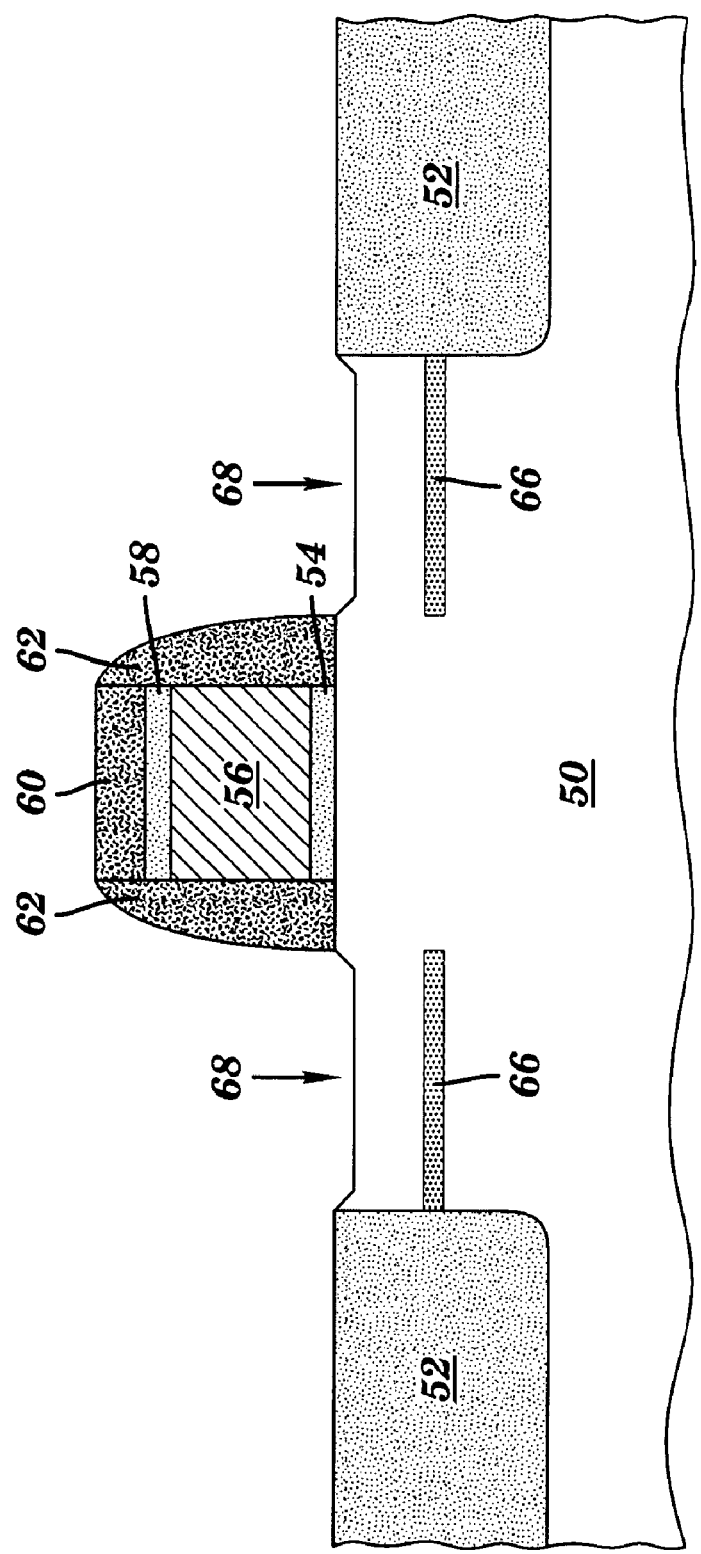
Figure 11:
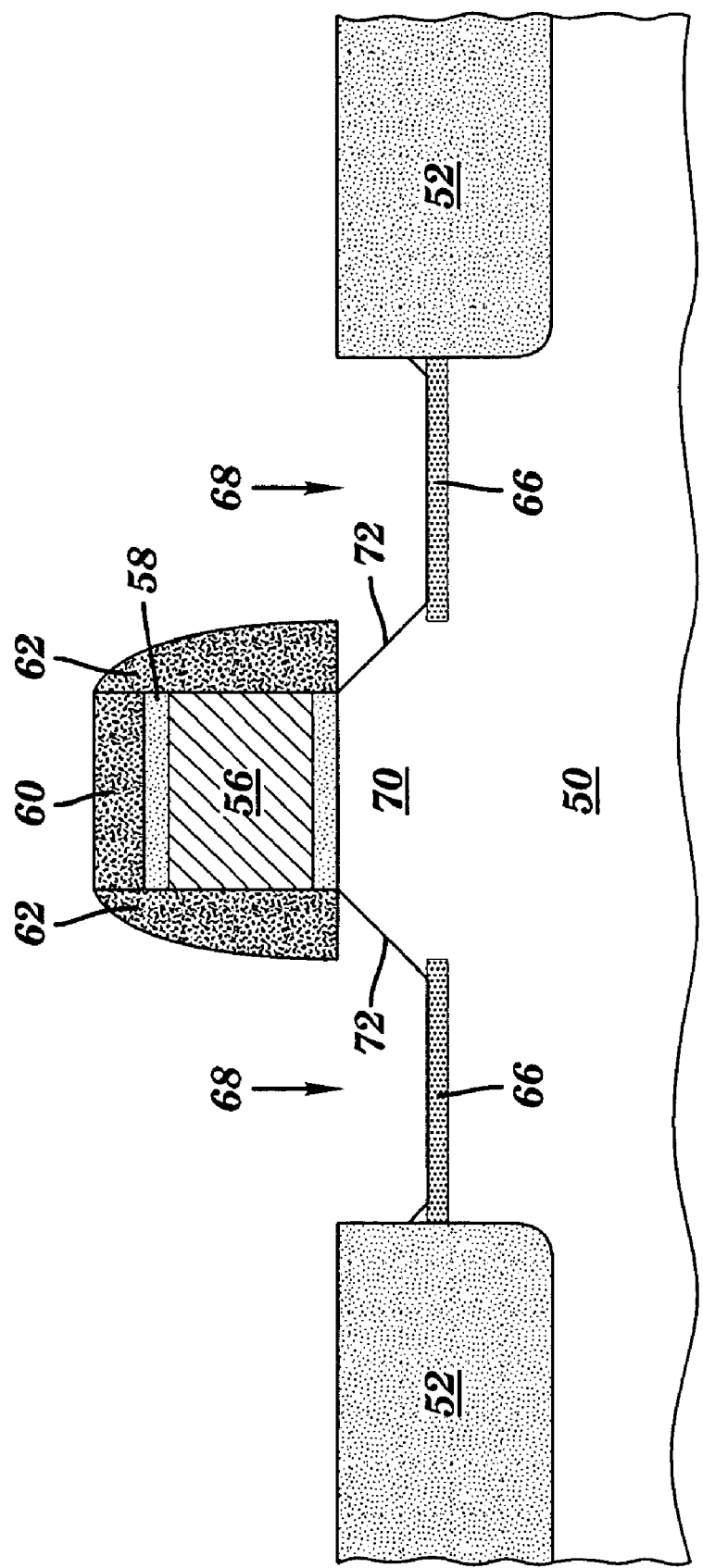

As illustrated in FIG. 10, the exposed surfaces of the substrate 50 can be subjected to an isotropic wet etch selective to silicon to form recessed regions 68. For example, the substrate 50 can be contacted with a hydroxide etchant such as TMAH, NH$_4$OH, NaOH, KOH, etc. As shown in FIG. 11, this etch of substrate 50 can be continued for a time effective to extend recessed regions 68 well below the substrate surface and to undercut dielectric spacers 62, thereby defining a channel region 70 having undercut areas. Due to the isotropic nature of the etch, the sidewalls 72 of the channel region 70 become slanted in an outward direction from the surface of the channel region 70 toward the base of recessed regions 68. The doped etch stop regions 66 can inhibit etching of those areas of substrate 50 beneath recessed regions 68, while the oxide and nitride layers 18 and 20 can protect the gate conductor 16 from being etched.

Figure 12:
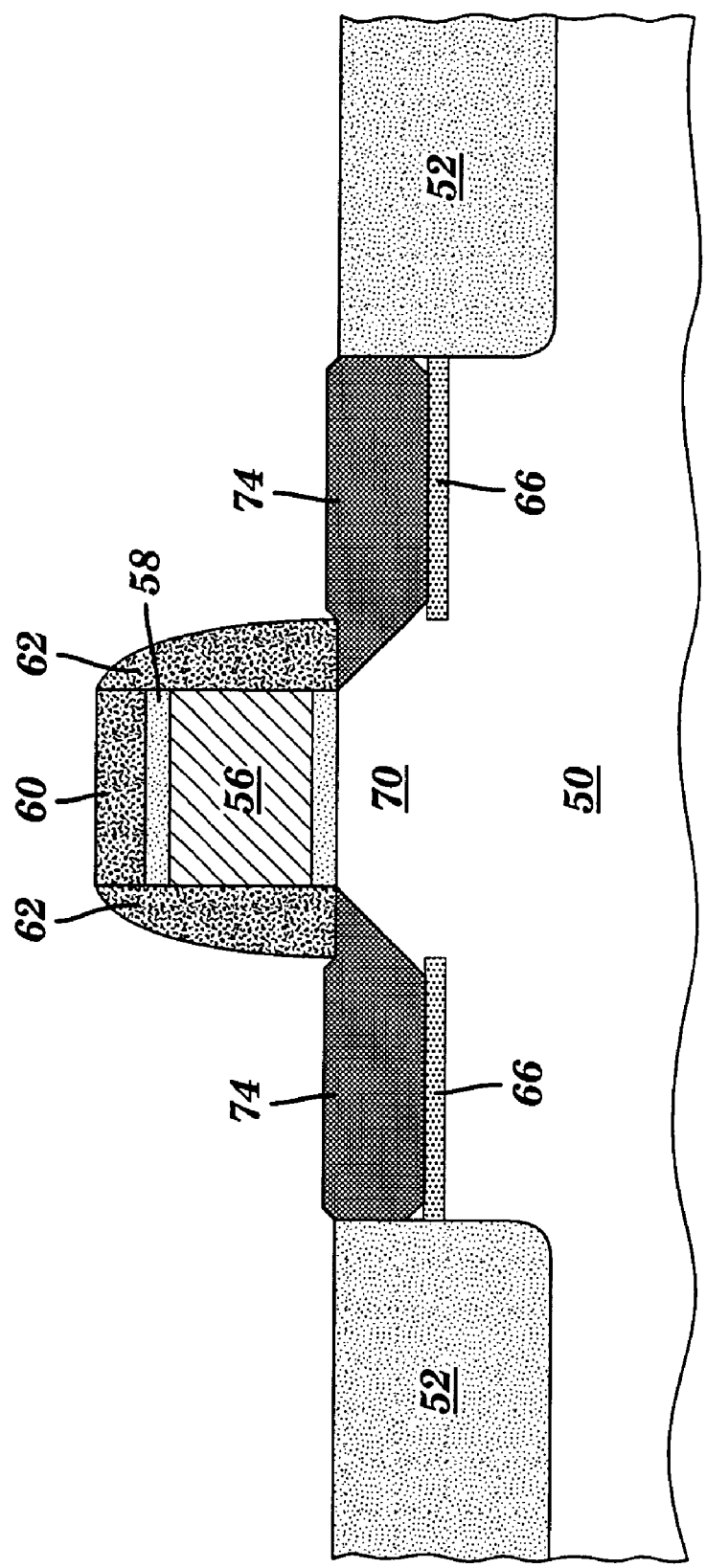

As shown in FIG. 12, epitaxially grown source and drain regions 74 can then be formed in the recessed regions such that they extend laterally under the dielectric spacers 62 into the undercut areas of the channel region 70. The epitaxial growth can be performed at a temperature of about 500° C. to about 900° C. and a pressure of about 1 Torr to about 100 Torr using precursors such as SiH$_4$, SiH$_2$Cl$_2$, GeH$_4$, HCl, B$_2$H$_6$, SiH$_3$CH$_3$, etc. In a preferred embodiment, the epitaxial growth is performed at a temperature of about 700° C. and a pressure of about 10 Torr. When forming a PFET device, the epitaxial source and drain regions 74 can comprise, e.g., SiGe, and when forming an NFET device, the epitaxial source and drain regions 74 can comprise, e.g., SiC. The nitride and oxide capping layers 58 and 60 can then be removed in the same manner as described in the first embodiment to allow metal silicide contact areas and then metal contacts to be formed on the gate conductor 56 and the epitaxial source and drain regions 74.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a transistor device, comprising:
   forming a semiconductor topography comprising a gate conductor disposed above a semiconductor substrate between a pair of dielectric spacers;
   performing an implantation to form etch stop regions a spaced distance below an implanted top surface of the semiconductor substrate such that a top surface of etch stop regions is disposed below a top surface of the semiconductor substrate;
   following forming the etch stop regions, selectively etching exposed regions of the semiconductor substrate on opposite sides of the dielectric spacers to form recessed regions in the substrate that undercut the dielectric spacers and define a channel region between the recessed regions comprising undercut areas, wherein a bottom of the recessed regions stops on the etch stop regions; and
   epitaxially growing source and drain regions in the recessed regions of the semiconductor substrate such that the source and drain regions extend underneath the dielectric spacers into the undercut areas of the channel region.

2. The method of claim 1, wherein the selectively etching the exposed regions of the semiconductor substrate comprises contacting the semiconductor substrate with a hydroxide etchant to make the sidewalls of the channel region slanted such that the sidewalls extend outwardly from a surface of the channel region toward a recessed surface of the semiconductor substrate, and wherein the epitaxially grown source and drain regions comprise silicon germanium when the transistor device is a PFET or silicon carbide when the transistor device is a NFET.

3. The method of claim 2, wherein the etching comprises an isotropic, wet etch.

4. The method of claim 1, wherein the forming the etch stop regions comprises:
   implanting a p-type species if the transistor device is a PFET or implanting an n-type species if the transistor device is a NFET; and
   annealing the semiconductor substrate.

5. The method of claim 4, wherein the p-type species comprises boron implanted at an energy of about 10 keV to about 100 keV and a dosage of about $2 \times e^{14}$ ions/cm$^2$ to about $2 \times e^{15}$ ions/cm$^2$, boron difluoride implanted at an energy of about 10 keV to about 100 keV and a dosage of about $2 \times e^{14}$ ions/cm$^2$ to about $1 \times e^{15}$ ions/cm$^2$, or a combination comprising at least one of the foregoing species.

6. The method of claim 1, wherein the forming the etch stop regions comprises implanting silicon, germanium, carbon, xenon, or a combination comprising at least one of the foregoing species.

* * * * *